United States Patent [19]
Tamura et al.

[11] 4,274,107
[45] Jun. 16, 1981

[54] MEMORY-TYPE AUTOMATIC ADJUSTMENT SYSTEM

[75] Inventors: Eiji Tamura, Tama; Takashi Nakamura, Hadano, both of Japan

[73] Assignee: Sony Corporation, Tokyo, Japan

[21] Appl. No.: 881,372

[22] Filed: Feb. 27, 1978

[30] Foreign Application Priority Data

Feb. 28, 1977 [JP] Japan ................... 52-21848

[51] Int. Cl.$^3$ ............... H04N 9/535; H03K 21/36
[52] U.S. Cl. ..................... 358/29; 358/171; 328/168; 307/222 R; 455/182
[58] Field of Search ............ 358/29, 27, 28, 30, 358/34, 51, 10, 161, 168, 169, 170, 227, 228, 171, 174–179, 191.1; 325/401, 411, 390, 400, 407; 328/175, 146, 168, 162, 173; 307/222 R, 222 B, 222 C, 264, 360; 330/279, 284; 455/234, 237, 245, 249, 182; 323/101

[56] References Cited

U.S. PATENT DOCUMENTS

| | | | |
|---|---|---|---|
| Re. 28,774 | 4/1976 | Kubota et al. ................. | 358/29 |
| 3,378,786 | 4/1968 | Andrea ........................... | 325/407 |
| 3,636,462 | 1/1972 | Baldauf, Jr. ................... | 328/175 |
| 3,670,100 | 6/1972 | Briggs et al. .................. | 358/171 |
| 3,838,310 | 9/1974 | Varian ............................ | 358/51 |
| 3,882,412 | 5/1975 | Apple ............................. | 331/17 |
| 3,903,472 | 9/1975 | Wahl .............................. | 325/392 |
| 3,949,158 | 4/1976 | Rzeszewski ................... | 325/423 |
| 3,953,801 | 4/1976 | Podowski ...................... | 325/390 |
| 3,970,777 | 7/1976 | Bradford et al. .............. | 358/169 |
| 4,037,254 | 7/1977 | Monahan ....................... | 358/228 |

FOREIGN PATENT DOCUMENTS

2320530 11/1974 Fed. Rep. of Germany.

OTHER PUBLICATIONS

Kida et al., "Development of High Sensitivity Color TV Camera", *NEC Research and Development Bulletin*, No. 40, Jan. 1976, pp. 86–95.

*Primary Examiner*—John C. Martin
*Attorney, Agent, or Firm*—Lewis H. Eslinger; Alvin Sinderbrand

[57] ABSTRACT

A memory-type control system for producing and storing a control signal which is used in an automatic adjustment system. A signal, having a parameter to be controlled, is provided; and a detecting circuit detects when the parameter is within a predetermined range. An UP/DOWN counter counts clock pulses and is responsive to the detecting circuit for counting in one direction when the detected parameter is greater than the predetermined range, for counting in a second direction when the detected parameter is less than the predetermined range and for ceasing its counting when the detected parameter is within the predetermined range. A parameter control circuit uses the count of the counting means as a control signal to adjust the parameter so as to bring said parameter within the predetermined range. A typical application of the automatic adjustment system is a white-balance control system for use with video camera apparatus.

19 Claims, 9 Drawing Figures

MEMORY-TYPE AUTOMATIC ADJUSTMENT SYSTEM

BACKGROUND OF THE INVENTION

This invention relates to a memory-type automatic adjustment system, and more particularly, to such a system wherein a particular parameter of a signal, such as the gain of a signal, is automatically controlled. A preferred application of the present invention is in a white balance adjustment circuit for a video camera.

In some automatic adjustment systems, an input signal or signals is controlled in accordance with a predetermined or desired condition. For example, in an automatic gain control system, the gain of an input signal is controlled in accordance with a reference level such that if the input signal level or the reference level varies, a corresponding adjustment is made in the gain of the controlled signal. Often, the condition upon which an adjustment is made is not continuous. Rather, a determination of a proper control signal may be made during one time period and this determined control signal then may be stored for future time periods in order to effect an automatic adjustment operation.

The foregoing type of an automatic adjustment or control operation advantageously utilizes a memory-type control device. One such use of the memory-type control device is in an automatic white balance adjustment system for a video camera. In a color television camera, a proper white balance is achieved when the individual color signals are of predetermined amplitudes, or levels, when a white object is viewed by the camera. However, even if the white balance of the camera is set or adjusted to be correct for one color temperature of an object, this white balance may be lost or otherwise degraded in the event that the color temperature of illumination for the object changes. A loss of the white balance condition also may arise when the operating temperature of the electrical apparatus included in the camera changes, or due to other changes in the electrical components over long periods of time. Accordingly, to account for these changes, it often is necessary to update the white balance of the color video signals, and then to use the updated, balanced signals to control the respective gains of the color signals.

In controlling the white balance of color video signals, a white object is viewed, for example, a white wall, board, or other reference object, and the gains, or levels, of the respective color signals which are produced in response to the viewed white object are adjusted until proper white balance is attained. The control signals which ultimately result in the proper white balance are stored and are used as gain control signals when the camera apparatus views other objects, such as a televised scene. When the white balance changes, or is expected to change, because of the above-mentioned conditions, the gain control signals are updated by performing again the aforementioned white balance operation.

One type of white balance control system which is effective in controlling the white balance of color video signals is disclosed in U.S. Pat. No. Re. 28,774. In that system, color difference signals, such as the red (R-Y) and blue (B-Y) color difference signals are integrated and supplied to respective memory circuits for controlling the gains of the red and blue video signals which are produced by the color camera. When proper white balance is attained, the color difference signals R-Y and B-Y each are zero. This zero level establishes the proper gain of the respective red and blue gain control circuits. In the event that the white balance is lost, a corresponding color difference signal voltage is produced and is used to adjust the gains of the red and blue signals in a direction so as to restore the white balance. The signal levels which are used to establish the gains of the red and blue gain control circuits so as to provide proper white balance are stored. Hence, when the camera is used to televise a scene other than a reference white object, the televised scene likewise will have a proper white balance in accordance with the stored control signals. In another embodiment of the white balance control system disclosed in this patent, red-green (R-G) and blue-green (B-G) color difference signals are used to determine whether proper white balance of a viewed white reference object is achieved. That is, the R-G and B-G signals are used to adjust the respective gains of the red and blue signals such that the difference between the gain-controlled red and blue signals and the green signal result in correct white balance. The control signals which attain this proper balance are stored and used to establish the gains of the red and blue signals when the video camera apparatus is used to view a televised scene.

In yet another type of white balance control system, white balance is achieved by using the camera to view a white reference object and then to control the level of the luminance component Y in such a manner that the color difference signals R-Y ad B-Y, derived from the viewed white object, each are zero. The control signals which result in proper white balance then are stored and used to control the gain of the luminance component for further usage of the video camera.

In the white balance control systems of the type described above, the control signals, such as the gain control signals, which must be stored and used when the camera televises a normal scene generally are stored by a memory circuit constituted by a capacitor. However, as is known, a capacitor usually is accompanied by leakage, whereby the level of a signal stored thereacross is degraded, or reduced, over prolonged periods of time. Hence, although the control signal stored across the capacitor initially will be correct to achieve proper white balance, the leakage of this signal soon will result in a loss of white balance. This means that frequent readjustments in white balance are necessary.

Another type of memory-type white balance control system is described in NEC Research and Development Bulletin, No. 40, January 1976, wherein an UP/DOWN counter is used to derive and store a digital control signal which is converted to an analog gain control signal. However, this publication does not describe how the UP/DOWN counter is controlled other than by suggesting that red-green and blue-green difference signals are used.

OBJECTS OF THE INVENTION

Therefore, it is an object of the present invention to provide an improved memory-type automatic adjustment system.

Another object of this invention is to provide a memory-type gain control system which avoids the disadvantages attending prior art memory-type gain control systems.

A further object of this invention is to provide a memory-type automatic adjustment system which uses a digital counter for deriving and storing a gain control signal.

An additional object of this invention is to provide a memory-type white balance control system for use in video camera apparatus.

Yet another object of this invention is to provide a memory-type white balance control system wherein a digital counter is used to derive and produce a control signal based upon the deviation of a color difference signal from a predetermined range.

Various other objects, advantage and features of the present invention will become readily apparent from the ensuing detailed description, and the novel features will be particularly pointed out in the appended claims.

SUMMARY OF THE INVENTION

In accordance with this invention, a memory-type control system is provided for producing and storing a control signal which is used to automatically adjust a predetermined parameter of an input signal. A detecting circuit detects when the predetermined parameter is within a present range. An UP/DOWN counter counts clock pulses in a first direction when the parameter is detected as being greater than said preset range and counts in a second direction when the parameter is detected as being less than said preset range. The UP/DOWN counter ceases its counting when the parameter is detected as being within the preset range. The count of the counter is used as a control signal for adjusting the predetermined parameter in a manner so as to bring that parameter within the preset range.

In one application of the aforedescribed memory-type control system, the system is used as a white balance control system for controlling the white balance of color video signals produced by video camera apparatus. In that system, the input signal is a color difference signal and the parameter thereof which is controlled is the level of the color difference signal. The white balance control system is made operative when the camera views a white object; and the parameter adjustment circuit is an automatic gain control circuit which controls the level of a component included in the color difference signal, which component is fed back to and combined with the color difference signal, whereby the level of the combined signal is controlled to effect a proper white balance.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

The present invention, now to be described, finds general application as a memory-type adjustment system, such as a memory-type gain control device. Notwithstanding the general application of this invention, it will be described in the environment of an intended application thereof as a memory-type white balance control system. However, it should be readily understood that this invention need not be limited solely to this environment. Those of ordinary skill in the art readily will appreciate that this invention can be used as, and is contemplated for use in, various types of adjustment systems wherein a control system is to be stored for prolonged periods of time.

Figure 1:
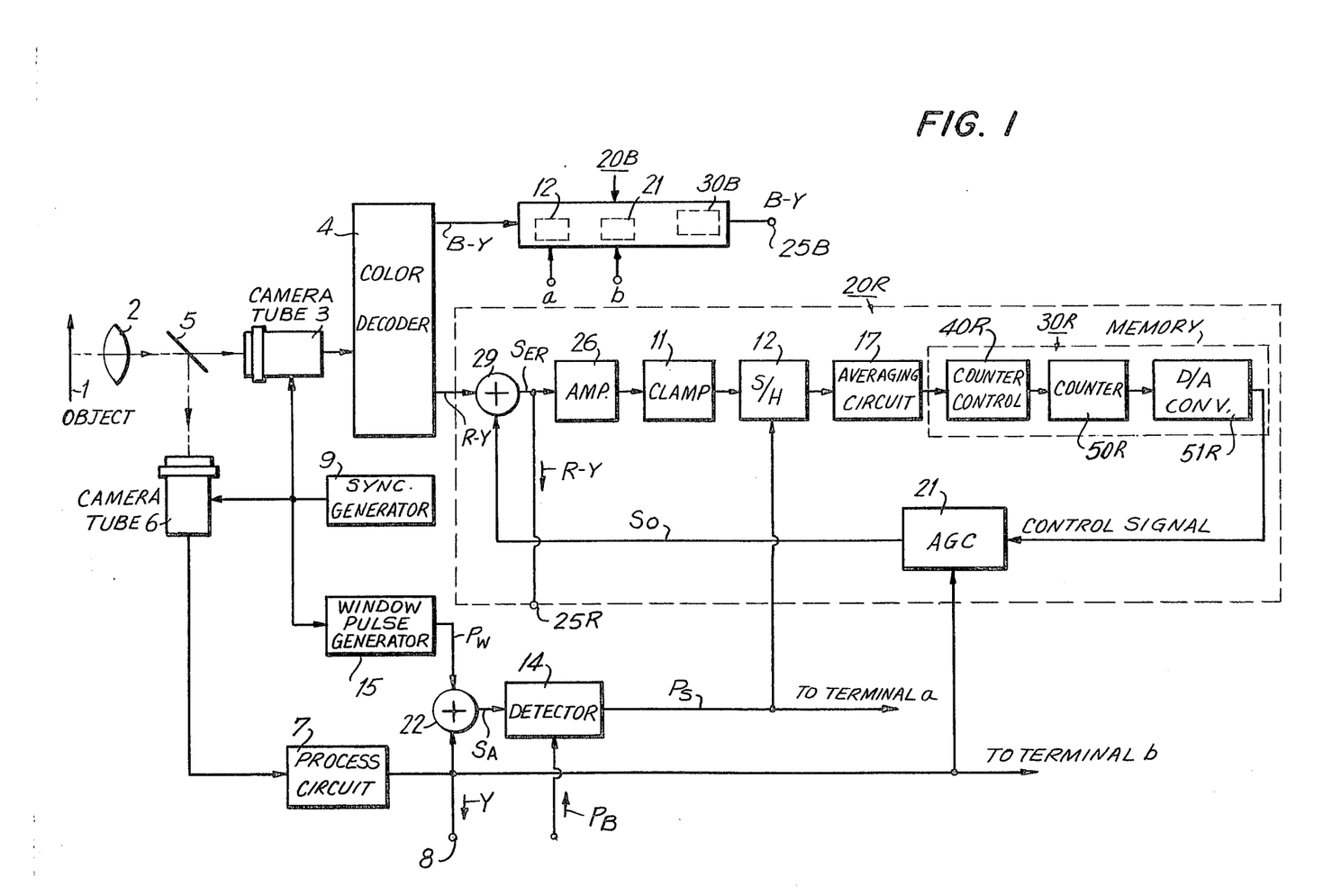
FIG. 1 is a block diagram showing one application of the present invention to a white balance control system.

Turning now to FIG. 1, there is illustrated a white balance adjustment system for use with video camera apparatus and with which the memory-type control system of the present invention can be employed. The video camera apparatus shown herein is the two-tube type color camera; but, as will be appreciated, the camera apparatus alternatively could be a one-tube, a three-tube or a four-tube camera. An optional lens 2 is in optical communication with a camera tube 3 and with a camera tube 6. A half-mirror 5, or other beam-splitting device, serves to transmit a portion of the video image focused by lens 2 through the camera tube 3 and to reflect a portion of the video image to camera tube 6. Camera tube 3 is adapted to produce color video signals and to supply such color video signals to a conventional color decoder 4. In this respect, camera tube 3 is conventional and may comprise a vidicon tube having a color coding filter. The color decoder functions to produce color difference signals from the color signals supplied thereto by camera tube 3. As an example, color decoder 4 produces red (R-Y) and blue (B-Y) color difference signals, wherein the component Y of the color difference signals is the luminance component. Although not shown herein, for the purpose of white balance, the color difference signals produced by color decoder 4 may be the R-G and B-G color difference signals, wherein R, B and G are the red, blue and green video signals, respectively.

A synchronizing signal generator 9 is coupled to camera tubes 3 and 6 to supply horizontal and vertical drive signals $H_D$ and $V_D$ thereto. These drive signals scan electron beams across target plates of the camera tubes in the horizontal and vertical directions, as is conventional. Hence, the color signals produced by camera tube 3 are the color signals of the object which is imaged by lens 2 and half-mirror 5 onto the camera tube. Similarly, the video signals produced by camera tube 6 are the luminance signals of the object which is imaged onto the camera tube by lens 2 and half-mirror 5.

As is appreciated, camera tubes 3 and 6 need not necessarily include a scanning electron beam. Nevertheless, synchronizing signal generator 9 supplies synchronizing drive signals to these camera tubes to produce proper color difference and luminance signals therefrom.

The luminance signal produced by camera tube 6 is supplied to a processing circuit 7, such as a gamma corrector, from which the luminance component Y is derived. This luminance component Y is derived from an output terminal 8 for use in a conventional color encoder (not shown) whereby color video signals are encoded for transmission. As one example, the color encoder may be an NTSC-type encoder. As another example, the color encoder may be a PAL-type encoder.

The color difference signals produced by color decoder 4, shown herein as R-Y and B-Y color difference signals, are supplied to respective channels 20R and 20B for the purpose of white balance adjustment. That is, channels 20R and 20B are operable to modify the respective color difference signals in a manner such that these color difference signals are properly balanced when the video camera apparatus views a white object. In particular, when a white object is viewed by the camera apparatus, the respective color difference signals R-Y and B-Y should be zero. If white balance is lost, this zero condition will not be attained. The purpose of channels 20R and 20B is to modify the gain of one of the components in each color difference signal, such as the luminance component Y or the color component R in the R-Y signal, whereby the color difference signals become zero. In the embodiment shown in FIG. 1, the level of the luminance component Y is adjusted, and the adjusted luminance component then is added to each of the color difference signals so that the resultant color difference signal is zero. Once this white balance is attained, the level adjustment to the luminance component, for example, the gain of an amplifier which is used to adjust the luminance component level, is stored and used when further scenes are viewed or televised by the camera apparatus.

Channels 20R and 20B are substantially the same. Hence, in the interest of brevity, only channel 20R is shown and described in detail. A level adjustment circuit 21, such as an automatic gain control (AGC) circuit has an input connected to terminal 8 for receiving the luminance component Y and an output connected to a combining circuit 29. AGC circuit 21 additionally includes a control input to which a gain controlling signal is supplied. Combining circuit 29 is an algebraic adding circuit having one input connected to the output of AGC circuit 21, as aforesaid, and another input connected to receive the color difference signal, such as R-Y, from color decoder 4. The output of combining circuit 29 is connected to an output terminal 25R to supply a white-balanced color difference signal thereto. When a white object is viewed by the camera apparatus, such as a white wall, a white building, a snowfall, or the like, the luminance component Y derived at terminal 8 has its level corresponding to the white level, and each of the color difference signals produced by color decoder 4 likewise corresponds to the viewed white object. For proper white balance, each color difference signal should be equal to zero. If, for example, the color difference signal R-Y is not equal to zero, then an adjustment should be made in order to restore proper white balance. AGC circuit 21 is controlled by the control signal applied thereto to vary the level of the luminance component Y to produce a modified luminance component $\Delta Y$. When this modified luminance component $\Delta Y$ is added to the color difference signal R-Y, the resultant combined signal $(R-Y+\Delta Y)$ becomes equal to zero. Hence, white balance is restored. Stated otherwise, the output of combining circuit 29 is equal to a white-balanced color difference signal. If the control signal which is applied to AGC circuit 21 is stored for further use, then when the camera apparatus is used to view different scenes, that is, objects other than a white reference object, the color difference signal R-Y produced by combining circuit 29 and supplied to output terminal 25R always will be a proper white-balanced color difference signal.

Channel 20B functions in an analogous manner to derive a white-balanced color difference signal B-Y at output terminal 25B. That is, luminance component Y is applied to an input terminal b in each of channels 20R and 20B for AGC operation thereon by AGC circuits 21 in each channel. Of course, the control signal applied to each AGC circuit may differ from each other, in accordance with the level of the color difference signals produced by decoder 4. Nevertheless, when the level-adjusted luminance component $\Delta Y$ is combined with each of the color difference signals, the color difference signal outputs at output terminals 25R and 25B will be properly white balanced.

The apparatus which is used in channel 20R (and also in channel 20B) for producing and supplying a proper gain control signal to AGC circuit 21 is comprised of a clamp circuit 11, a sample and hold circuit 12, averaging circuits 17 and a memory circuit 30R (30B is channel 20B). Clamp circuit 11 is coupled to the output of combining circuit 29 by an amplifier 26 and is provided for eliminating a level change resulting from a change of the dark current in camera tube 3. The output of clamp circuit 11 is connected to sample and hold circuit 12 which functions to sample the level of the color difference signal during a white balance adjustment operation. Since the color difference signal which is supplied to the sample and hold circuit is derived from the output of combining circuit 29, this color difference signal is referred to herein as the white-balanced color difference signal. As mentioned above, the white-balanced color difference signal is equal to zero when a proper white balance is attained. Accordingly, if the white-balanced color difference signal is not equal to zero, then this output of combining circuit 29 may be considered as an error signal $S_{ER}$. The function of channel 20R, as well as channel 20B, is to reduce the error signals $S_{ER}$ and $S_{EB}$ to zero.

The output of sample and hold circuit 12, that is, the sampled white-balanced color difference signal, or sampled error signal $S_{ER}$, is coupled to averaging circuits 17. The averaging circuits function to eliminate spurious changes in the sampled error signal produced by sample and hold circuit 12. If desired, averaging circuits 17 may be omitted.

As shown in FIG. 1, the output of sample and hold circuit 12 is supplied through averaging circuits 17 to a memory device 30R. This memory device, shown in greater detail with respect to FIG. 4, includes a counter control circuit 40R, a digital counter 50R, and a digital-to-analog (D/A) converter 51R. The function of memory device 30R is to produce the aforedescribed control signal which is applied to AGC circuit 21. This control signal is produced as a function of the sampled error signal $S_{ER}$ and determines the amount of adjustment to the luminance component level which is needed to reduce the sampled error signal to zero. Once the sampled error signal is reduced to zero, or approximately to zero, the control signal which is produced to achieve this operation is stored in memory device 30R and is used as the gain control signal for the luminance component for further usage of the video camera apparatus.

As mentioned above, sample and hold circuit 12 is operable to sample the white-balanced color difference signal produced by combining circuit 29, that is, the error signal $S_{ER}$, when the camera apparatus views a white object. Accordingly, the sampling signal which is supplied to the sample and hold circuit is produced when the luminance component Y is of a level corresponding to the white level. If the white object which is viewed by the camera apparatus is uniformly white over an entire video field or frame, then the sampled signal can be produced during any one or more horizontal line intervals in that field or frame. However, it is known that a video image is most stable at the middle portion of the video picture. Thus, it is preferred that the sampling signal be produced when the middle portion of the video picture is at the white level. These conditions for generating the sampling signal are satisfied by the illustrated sampling signal generator comprised of a window pulse generator 15, an adding circuit 22 and a detecting circuit 14.

Figure 2:
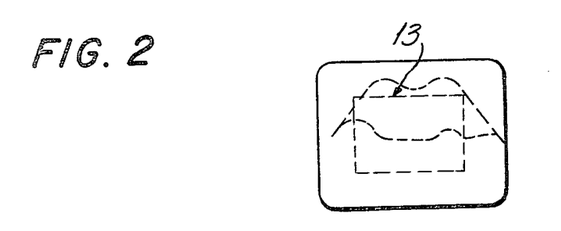
FIG. 2 is a diagram of a televised object which is useful in understanding the operation of the system shown in FIG. 1.

Window pulse generator 15 is supplied with the horizontal and vertical drive signals $H_D$ and $V_D$ produced by synchronizing signal generator 9 and is adapted to generate a pulse $P_W$ of predetermined amplitude and duration. Referring to FIG. 2, let it be assumed that the video picture of an object viewed by the camera apparatus is as shown by the outer rectangular shape formed of a solid line. A more stable portion of this video picture is enclosed within the broken rectangle 13. Now, within this more stable rectangular portion, a horizontal line interval which occurs during the middle portion of the video picture can be assumed to be the most stable. The purpose of window pulse generator 15 is to generate pulse $P_W$ during the central portion of the horizontal line interval which occurs in the middle portion of rectangle 13. For this purpose, window pulse generator 15 may include counting circuits which serve to count the horizontal drive signals following a vertical synchronizing signal to detect when the camera apparatus scans the middle portion of rectangle 13. Thus, after a predetermined count of horizontal drive signals is attained, pulse $P_W$ is generated, as by triggering a monostable multivibrator.

Figure 3A:
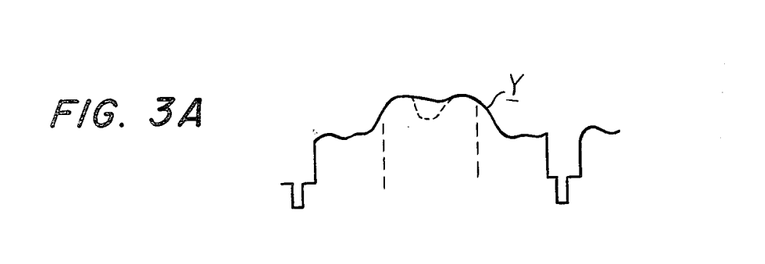
FIGS. 3A–3D are waveform diagrams which are helpful in understanding the operation of the system shown in FIG. 1.
Figure 3B:
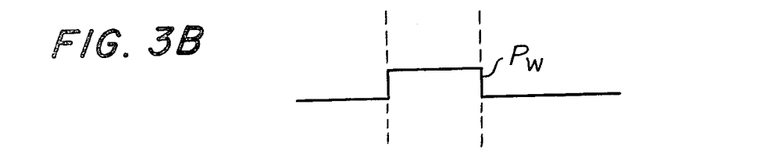

Let it be assumed that the horizontal line interval corresponding to the middle portion of rectangle 13 is represented by the luminance component Y shown in FIG. 3A. Window pulse generator 15 detects when this horizontal line interval is being scanned to produce the window pulse $P_W$ shown in FIG. 3B. As illustrated therein, pulse $P_W$ is generated during the central portion of the horizontal line interval shown in FIG. 3A, and exhibits a predetermined duration and amplitude. This window pulse $P_W$ is supplied to one input of adding circuit 22, and another input of adding circuit 22 is connected to processing circuit 7 for receiving the luminance component Y (FIG. 3A).

Figure 3C:
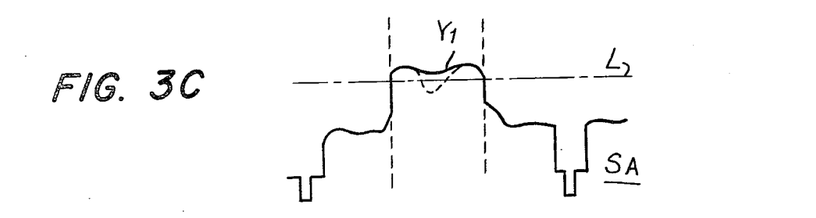
Figure 3D:
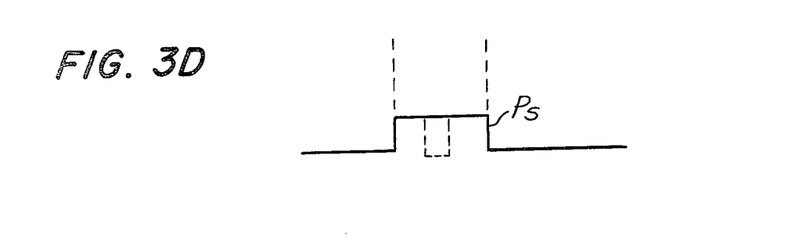

Adding circuit 22 sums the luminance component Y and the window pulse $P_W$ to produce a summed signal $S_A$, shown in FIG. 3C. That is, summed signal $S_A$ is formed by the superposition of pulse $P_W$ and luminance component Y. This summed signal $S_A$ is supplied to detecting circuit 14. The detecting circuit is provided with a threshold level L corresponding to a white level. If the summed signal $S_A$ exceeds threshold level L, detecting circuit 14 generates an output sampling pulse $P_S$, as shown in FIG. 3D. As one embodiment thereof, detecting circuit 14 may be formed of a Schmitt trigger or other threshold detector capable of sensing when summed signal $S_A$ exceeds the threshold level L. In addition, a blanking signal $P_B$, produced by conventional circuitry, is supplied to detecting circuit 14 to prevent the detecting circuit from responding to signals during horizontal and vertical blanking intervals.

It is appreciated that window pulse $P_W$ is produced during each field of frame interval of the video signals produced by the camera apparatus. That is, one window pulse $P_W$ may be produced during each field interval or, if desired, one window pulse may be produced during each frame interval. In addition, threshold level L is set high enough such that detecting circuit 14 does not generate a sampling pulse $P_S$ in the absence of a window pulse $P_W$, even if the luminance component Y itself corresponds to a white level. That is, threshold level L is higher than the maximum level of the luminance component in the absence of the superposition of window pulse $P_W$. This means that sampling pulse $P_S$ is produced only during the central portion of the middle of each video picture. That is, sampling pulse $P_S$ is produced only during the middle portion of a predetermined horizontal line interval during each field or frame interval, provided the luminance component during that horizontal line interval corresponds to the white level. Hence, sampling pulse $P_S$ has a repetition frequency equal to the vertical drive frequency.

It is appreciated that the red error signal $S_{ER}$ produced at the output of combining circuit 29 is sampled during each field or frame interval by sampling pulse $P_S$. If this sampled level differs from zero, that is, the proper level for white balance, memory device 30R supplies a suitable gain control signal to AGC circuit 21 for adjusting the level of the luminance component Y which is combined with the color difference signal R-Y in combining circuit 29. Thus, the level of the error signal $S_{ER}$ correspondingly is adjusted. At the next sampling time represented by the next sampling pulse $P_S$, the adjusted error signal is sampled, and this sampled level again is examined to determine if it is equal to the desired zero level. If not, the control signal supplied to AGC circuit 21 is further modified, resulting in yet a further adjustment in the level of the luminance component Y fed back to and combined with the color difference signal R-Y. At each sampling interval, this operation is repeated until the error signal $S_{ER}$ is equal to the desired zero level. At that time, the control signal supplied to AGC circuit 21 is maintained constant and stored in memory device 30R. This control signal then is used to adjust the level of the luminance component for all further usage of the camera apparatus, thereby resulting in a proper white-balanced color difference signal R-Y at output terminal 25R. A similar operation is performed in channel 20B, resulting in a proper white-balanced color difference signal B-Y at output terminal 25B.

Since the luminance component Y which is used in producing the sampling pulse $P_S$ for channel 20R is the same luminance component which is used in determining the sampling pulse $P_S$ for channel 20B, it is appreciated that sampling pulse $P_S$ may be supplied in common to terminal a in each of channel 20R and channel 20B. That is, a separate sampling pulse generator need not be provided for each channel. Of course, if desired, such separate sampling pulse generators can be used.

One advantage of using average circuits 17 now will be described. Let it be assumed that the luminance component Y produced during the horizontal line interval corresponding to the central portion of the video picture includes a deviating portion shown by the broken line in FIG. 3A. When window pulse $P_W$ (FIG. 3B) is superposed onto the luminance component Y, the resultant signal $Y_I$ includes the deviating portion shown by the broken line in FIG. 3C. If this deviating portion of the superposed signal is less than the threshold level L, then detecting circuit 14 generates a sampling pulse $P_S$ which appears as two successive sampling pulses, represented by the broken lines in FIG. 3D. This means that sample and hold circuit 12 is supplied with two sampling pulses to produce two successive samples of the error signal $S_{ER}$. It is expected that, in some instances, these successive sampled levels of the error signal are not equal to each other. However, averaging circuits 17 average these successive samples to supply a substantially single sampled level of the error signal to memory device 30R. Hence, averaging circuits 17 function to "smooth" disturbances, abrupt changes or spurious samples of error signal $S_{ER}$.

Figure 4:
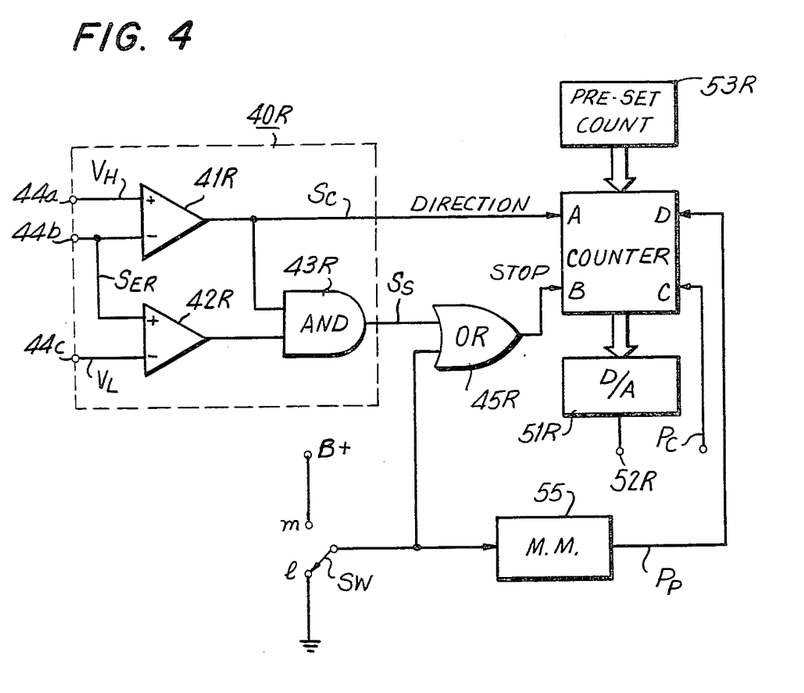
FIG. 4 is a logic diagram of one embodiment of a memory-type adjustment system in accordance with the present invention.

Referring now to FIG. 4, there is illustrated a logic diagram of one embodiment of memory device 30R. Counter control circuit 40R is comprised of a window comparator for determining if the sampled error signal $S_{ER}$ is within an amplitude-window. That is, the window comparator functions to detect when the sampled error signal is within a predetermined range of amplitude. This window comparator includes a first comparator 41R, having a non-inverting (+) input and an inverting (−) input, and a second comparator 42R also including non-inverting and inverting inputs. A relatively high reference level $V_H$ is provided at input terminal 44a and is supplied to the non-inverting input of comparator 41R. A relatively low reference level $V_L$ is provided at input terminal 44c and is supplied to the inverting input of comparator 42R. The inverting input of comparator 41R is connected in common with the non-inverting input of comparator 42R to input terminal 44b which, in turn, is connected to averaging circuits 17 for receiving the sampled error signal $S_{ER}$.

Comparator 41R functions to compare the sampled error signal level $S_{ER}$ to the high reference level $V_H$. If the sampled error signal exceeds the high reference level, comparator 41R produces an output signal $S_C$ of one polarity or amplitude. If the sampled error signal is less than the high reference level, output signal $S_C$ is of an opposite polarity, or is of a different amplitude. For a purpose soon to be described, signal $S_C$ is designated a count direction signal. In the embodiment shown herein, count direction signal $S_C$ is a count-up signal if $V_H > S_{ER}$, and is represented as a binary "1". Conversely, count direction signal $S_C$ is designed as a count-down signal, and is represented as a binary "0" if $S_{ER} > V_H$. Accordingly, and as may be appreciated, comparator 41R may be a differential amplifier, an operational amplifier, or any other conventional comparing circuit.

Comparator 42R is substantially similar to comparator 41R and produces an output signal, represented as a binary "1" if $S_{ER} > V_L$. This output signal produced by comparator 42R is represented as a binary "0" if $S_{ER} < V_L$. As will be described, the output signal produced by comparator 42R is used to enable or inhibit a counting operation.

Counter control circuit 40R additionally includes a coincidence circuit, such as an AND gate 43R having inputs connected to the outputs of comparators 41R and 42R, respectively. AND gate 43R produces an output signal $S_S$ which functions to control counter 50R. In particularly, if signal $S_S$ is a binary "1", counter 50R is inhibited. Conversely, if signal $S_S$ is a binary "0", then counter 50R is enabled.

Counter 50R is an UP/DOWN counter having respective input terminals A, B, C and D. Input terminal A receives the count direction signal $S_C$, and input terminal C receives clock pulses $P_C$ provided by a suitable source (not shown). Counter 50R is adapted to count clock pulses $P_C$ in an upward direction, that is, to increase the count thereof, in the event that count direction signal $S_C$ is a binary "1". Conversely, the counter counts clock pulses $P_C$ in a downward direction, that is, to decrement the count thereof, in the event that count direction signal $S_C$ is a binary "0".

Input terminal B of counter 50R is coupled to AND gate 43R via an OR gate 45R. If the signal supplied to input terminal B of the counter is a binary "0", for example, if signal $S_S$ is a binary "0", counter 50R is enabled to count clock pulses $P_C$ in the direction determined by count direction signal $S_C$. If the signal supplied to input terminal B is a binary "1", then counter 50R is inhibited from counting further clock pulses $P_C$.

Counter 50R is adapted to be preset, or loaded, with a predetermined count, for a purpose soon to be described. Accordingly, a predetermined count generator 53R is coupled to counter 50R. Input terminal D of counter 50R is supplied with a load pulse $P_P$ which, when present, loads counter 50R with the predetermined count supplied thereto by generator 53R. Load pulse $P_P$ is generated by a monostable multivibrator 55 which is triggered when a white balance operation is initiated, as will be described.

Thus, it is appreciated that counter 50R may be a plural stage digital counter, or register, having its individual stages coupled to predetermined count generator 53R for receiving the predetermined count generated by this generator in response to load pulse $P_P$. Since such a counter is well known, in the interest of brevity, further description thereof is not provided.

The output of counter 50R is supplied to D/A converter 51R for conversion to a corresponding analog signal which, in turn, is supplied from the output terminal 52R of the D/A converter to AGC circuit 21.

A manually operable switch SW is shown diagramatically as including a movable contact which is selectively engageable with fixed contacts m and l. Contact m is supplied with a suitable operating potential +B, and contact l is supplied with a reference potential, such as ground. When the movable contact of switch SW engages contact m, a binary "1" is supplied from switch SW to OR gate 45R and, additionally, to monostable multivibrator 55. When the movable contact of the switch engages contact l, a binary "0" is supplied to OR gate 45R and to the monostable multivibrator. Switch SW is operated by an operator of the white balance adjustment apparatus for the purpose of initiating a white balance adjustment operation. To initiate this operation, the movable contact of switch SW is moved from contact m to contact l, thereby triggering monostable multivibrator 55 to supply load pulse $P_P$ to input terminal D of counter 50R. At the completion of the white balance adjustment operation, the movable contact of the switch engages contact m, thereby inhibiting further adjustment. Although switch SW has been described as a manually operable switch, it is appreciated that, if desired, the aforedescribed switching function can be achieved automatically.

The operation of memory device 30R, as shown in FIG. 4, now will be described. As described previously, proper white balance is achieved when the level of error signal $S_{ER}$, that is, the level of the white-balanced sampled color difference signal, is approximately zero. In accordance with one aspect of the present invention, window comparator 40R functions to determine when the level of error signal $S_{ER}$ is within a narrow range about zero. Accordingly, the respective high and low reference levels $V_H$ and $V_L$ are selected to define this narrow range both above (postive) and below (negative) zero. Thus, the logic operation performed by window comparator 40R is represented by the following table:

| Input Level | $S_C$ | Output of (42R) | $S_S$ | Count Operation |
|---|---|---|---|---|
| $S_{ER} > V_H$ | low | high | low | DOWN |
| $V_L \leqq S_{ER} \leqq V_H$ | high | high | high | Stop |
| $S_{ER} < V_L$ | high | low | low | UP |

The clock pulses $P_C$, which are counted by counter 50R in response to the count direction signal $S_C$ and the inhibit/enable signal $S_S$, have a frequency equal to the frequency of the sampling pulses $P_S$. Thus, clock pulses $P_C$ have a frequency equal to the vertical drive frequency, or 60 Hz.

As an example, let it be assumed that the sampled error signal level $S_{ER}$ exceeds the range, or window, defined by reference levels $V_H$ and $V_L$. Accordingly, count direction $S_C$ is a binary "0", thereby establishing a count-down direction for counter 50R. If it is assumed that clock pulse $P_C$ is produced subsequent to sampling pulse $P_S$, then the count of counter 50R is decremented by one clock pulse. This decremented count is converted to a corresponding analog level by D/A converter 51R, and this analog level is supplied as a gain control signal to AGC circuit 21. Hence, the level of luminance component Y is correspondingly adjusted by AGC circuit 21, and this adjusted luminance component level is combined with color difference signal R-Y in combining circuit 29. This reduces the level of error signal $S_{ER}$. At the occurrence of the next sampling pulse $P_S$, the reduced level of error signal $S_{ER}$ is supplied to window comparator 40R, and this sampled level is compared to the window defined by reference levels $V_H$ and $V_L$. If the adjusted error signal still exceeds this window, counter 50R counts down in response to the next clock pulse $P_C$ to further decrement its count. This decremented count again is converted to a corresponding analog signal by D/A converter 51R, and the analog signal is supplied as a gain control signal to AGC circuit 21. Hence, the level of luminance component Y is further adjusted and combined with color difference signal R-Y in combining circuit 29 to further reduce the level of error signal $S_{ER}$. The foregoing operation is repeated until the level of the sampled error signal $S_{ER}$ is reduced sufficiently to fall within the window defined by reference levels $V_H$ and $V_L$. At that time, each of comparators 41R and 42R produces a binary "1", so as to energize AND gate 43R to produce a binary "1" inhibit signal $S_S$. This inhibit signal is transmitted through OR gate 45R to input terminal B of counter 50R, thereby inhibiting further operation of the counter. Thus, the last-attained count of the counter is stored therein, and this stored count is used as the gain control signal for establishing the gain of AGC circuit 21. That is, the count now stored in counter 50R is sufficient to establish the gain of AGC circuit 21 to a level whereby error signal $S_{ER}$ is zero, which, in turn, represents a proper white balance. This stored count is used to maintain the gain of AGC circuit 21 at all times during further operation of the camera apparatus. Consequently, such further operation will be carried out with proper white balance.

It may be appreciated that, if the level of the sampled error signal $S_{ER}$ is below the window established by reference levels $V_H$ and $V_L$, then count direction signal $S_C$ is a binary "1" to establish a count-up direction for counter 50R. Furthermore, comparator 42R produces a binary "0" which inhibits AND gate 43R from producing an inhibit signal $S_S$. Assuming that switch SW is operated to its "adjustment" condition, whereby the movable contact thereof engages contact 1, a binary "0" is supplied to each input of OR gate 45R. Hence, terminal B of counter 50R receives a binay "0", or a count-enable signal. A clock pulse $P_C$ is counted by counter 50R, whereby the count thereof is incremented. This count is converted to an analog signal by D/A converter 51R and is supplied as a gain control signal to AGC circuit 21. Thus, the level of luminance component Y is adjusted, and this adjusted component is combined with color difference signal R-Y in combining circuit 29 to increase the level of error signal $S_{ER}$. At the next sample interval, the modified error signal $S_{ER}$ is sampled, and the modified sampled level is compared to the window defined by reference levels $V_H$ and $V_L$. If error signal $S_{ER}$ is still below the window, counter 50R counts the next clock pulse $P_C$ in an upward direction. This operation is repeated until the level of the error signal $S_{ER}$ is increased sufficiently to fall within the window defined by reference levels $V_H$ and $V_L$. At that time, comparators 41R and 42R each produce a binary "1", whereby AND gate 43R produces the inhibit signal $S_S$, which is supplied as a binary "1" through OR gate 45R to terminal B of counter 50R. Consequently, counter 50R terminates further counting, and the last-attained count is stored therein and used as a control signal to establish the proper gain of AGC circuit 21. Thus, further operation of the camera apparatus is carried out with proper white balance.

It is preferred to provide a window, or "dead band" for error signal $S_{ER}$, rather than merely comparing the level of the error signal to a zero level. This is because it is expected that error signal $S_{ER}$ may differ by only a small amount from zero, yet still represent a proper white balance. In the absence of this window or dead band, if the error signal is slightly greater than zero, counter 50R will count down, resulting in a control signal which is used to reduce the level of the error signal. This reduction in the error signal level may result in an error signal which is less than zero. Consequently, counter 50R will count up to produce a control signal which is used to increase the level of the error signal. This continuous fluctuation in the level of the error signal, which both causes and results in the up and down counting of counter 50R, is unstable. Such unstable operation of the gain control circuit results in erroneous operation and improper white balance control. For these reasons, it is preferred to establish a window or dead band within which error signal $S_{ER}$ is driven. Once the error signal falls within this dead band, further operation of counter 50R is inhibited because a satisfactory white balance is achieved.

Figure 5:
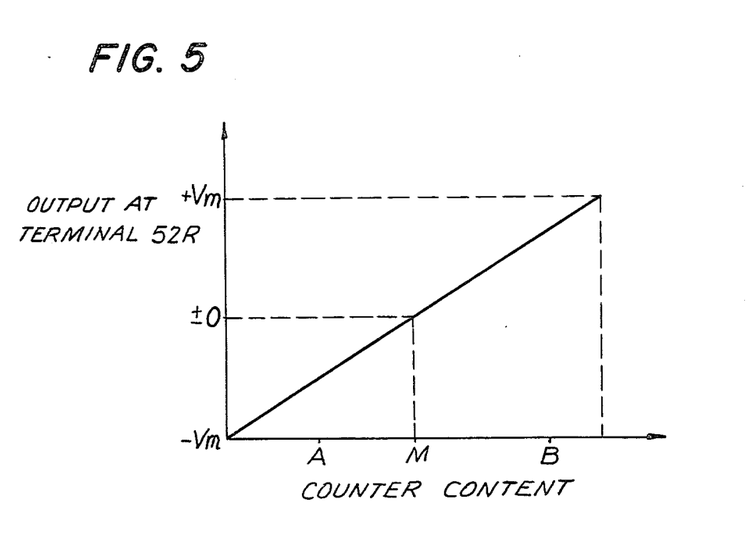
FIG. 5 is a graphical representation which is useful in understanding the operation of the counter used in the embodiment shown in FIG. 4.

Although the aforedescribed operation of counter 50R may proceed from, for example, a zero count, it is preferred that, when a white balance adjustment operation is to be performed, the predetermined count provided by generator 53R is loaded into counter 50R. This can be best understood by reference to the graphical depiction shown in FIG. 5 wherein the abscissa represents the count of counter 50R and the ordinate represents the control signal supplied to AGC circuit 21 by D/A converter 51R. It is possible that, in response to a previous white balance adjustment operation, the count stored in counter 50R corresponds to a minimum gain control signal $-V_m$. However, when the next white balance adjustment operation is performed, it may be necessary to change the count of counter 50R until a maximum gain control signal $+V_m$ is produced. This means that the count of counter 50R must be changed from a minimum count to a maximum count. This, of course, requires a considerable amount of time, especially since the count of counter 50R is changed by only one clock pusle at a time. Furthermore, the count of counter 50R, as well as the level of the gain control signal, must pass through an intermediate count M, corresponding to a zero gain control signal.

Taking the foregoing into consideration, it is appreciated that, at the start or initiation of a white balance adjustment operation, if the count M is preset, or loaded into counter 50R, this could significantly reduce the amount of time needed to complete the white balance adjustment operation. In accordance with the aforedescribed example, the maximum time required to change the AGC control signal from $-V_m$ to $+V_m$ is the time required to change the count of counter 50R from M to a maximum count, rather than from a minimum count to a maximum count. Hence, by presetting counter 50R to an intermediate count M, the time required to complete the white balance adjustment operation can be reduced by up to one-half the time that would be necessary in the absence of predetermined count generator 53R. As another example, if the immediately preceding count stored in counter 50R is equal to the count A (FIG. 5), and if this count must be changed to count B in order to adjust the white balance properly, for example, in the event of a change in the lighting condition, then it is seen that the time required to change the count from a preset count M to desired count B is substantially less than the time required to change the count of counter 50R from count A to count B. Here again, the time for adjusting the white balance is significantly reduced by presetting the count of counter 50R to the intermediate count M.

When the video camera apparatus is used normally for televising a scene, switch SW is set to its normal condition whereby the movable contact engages contact m. Consequently, a binary "1" is supplied through OR gate 45R from switch SW, thereby inhibiting counter 50R from counting clock pulses PC. This means that the last-attained count of the counter is stored therein and is used as the gain control signal for AGC circuit 21. If an operator wishes to adjust the white balance, switch SW is operated to its adjustment condition, whereby the movable contact thereof engages contact 1. This supplies a binary "0" to OR gate 45R, thereby conditioning the OR gate to respond to the count inhibit or enable signal $S_S$ supplied thereto by AND gate 43R. In addition, the negative transition in the signal produced by switch SW when switched to its adjustment condition triggers monostable multivibrator 55 to produce load pulse $P_P$. This loads counter 50R with the preset count supplied thereto by predetermined count generator 53R. Hence, the counter is preset to the aforedescribed intermediate count M, and then counts clock pulses $P_C$ either in an upward or downward direction depending upon count direction signal $S_C$. As is now recognized, this counting of counter 50R changes the gain control signal supplied to AGC circuit 21 is a direction to modify error signal $S_{ER}$ until this error signal exhibits a substantially zero level. That is, counter 50R continues to count until error signal $S_{ER}$ is within the dead band established by reference levels $V_H$ and $V_L$.

In the embodiment shown in FIG. 4, the last-attained count reached by counter 50R when inhibit signal $S_S$ is applied to input terminal B is stored in the counter and is used therefrom to derive the gain control signal. In an alternative embodiment, a separate storage register may be provided to receive the last-attained count reached by counter 50R. Suitable gating circuits can be interposed between counter 50R and this storage register, the gating circuits being energized in response to an inhibit signal $S_S$ or in response to a binary "1" produced by switch SW when switched from its adjustment condition to its normal condition. The count then stored in this separate register can be converted to an analog signal by D/A converter 51R and supplied as the gain control signal to AGC circuit 21. For the purpose of the present discussion, counter 50R, by itself, or the additional inclusion of such a separate storage register may be considered as part of the counting circuit shown in FIG. 4.

Figure 6:
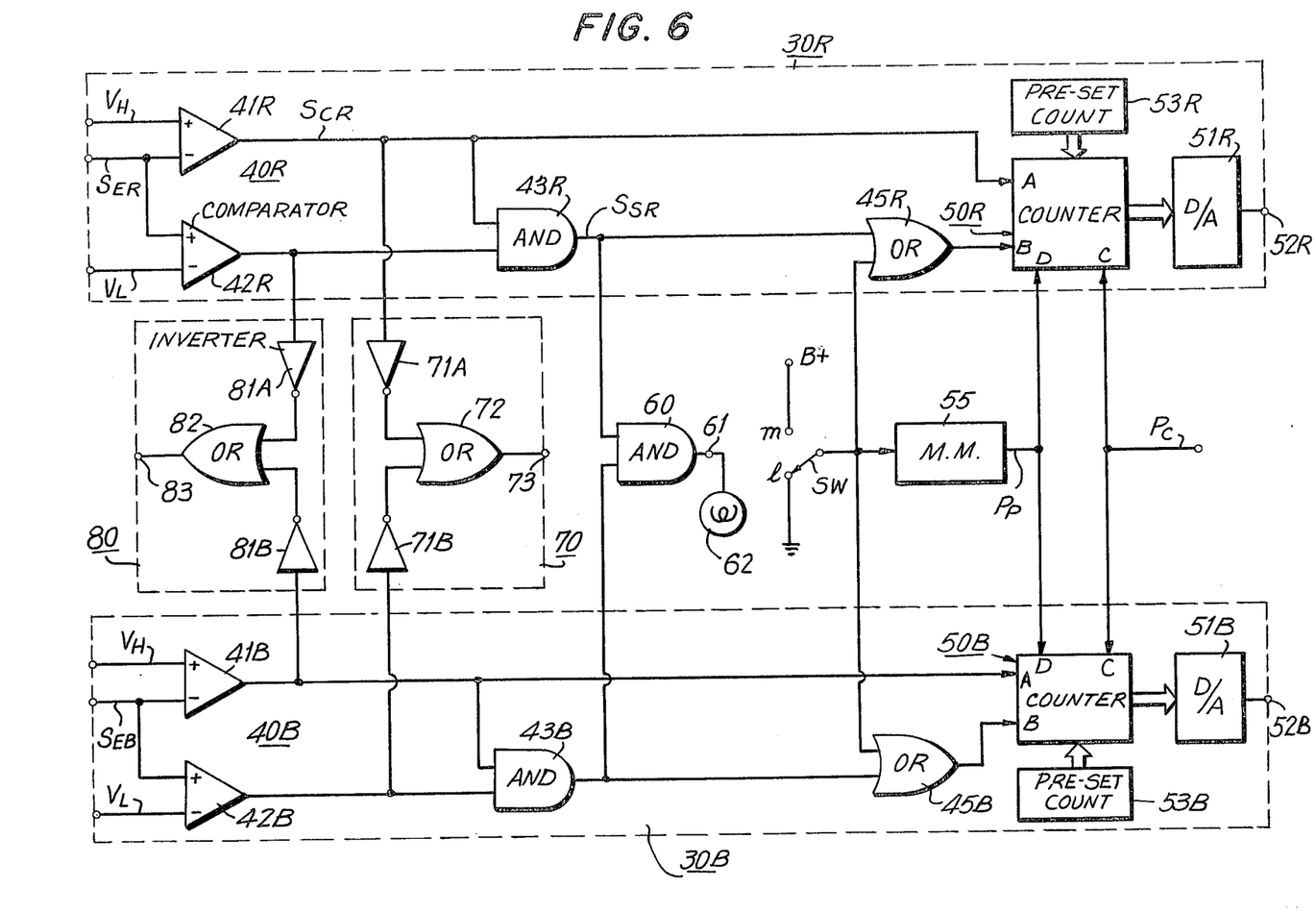
FIG. 6 is a logic diagram of another embodiment of a memory-type adjustment system which can be used as a white balance control system.

Turning now to FIG. 6, there is illustrated a logic diagram of a memory device 30R and a memory device 30B which are included in channels 20R and 20B, respectively (FIG. 1). Each of these memory devices is seen to be substantially identical to the memory device shown and described hereinabove with respect to FIG. 4. Accordingly, like component parts shown in FIG. 6 are identified with the same reference numerals as used in FIG. 4. In addition, the components comprising memory device 30B are identified with the same reference numerals as used to identify the similar components of memory device 30R, except with the additional suffix "B". Furthermore, clock pulses $P_C$ are seen to be supplied to input terminals C of both counters 50R and 50B. Similarly, load pulses $P_P$ are applied to input terminals D of both counters 50R and 50B. This means that both counters are preset with respective predetermined counts, as supplied thereto by predetermined count generators 53R and 53B, respectively. Still further, a single switch SW is shown in FIG. 6, this switch being coupled to OR gates 45R and 45B to the B inputs of counters 50R and 50B, respectively. Hence, some of the circuit elements previously discussed with respect to FIG. 4 can be used in common with both memory devices 30R and 30B.

FIG. 6 additionally includes an indicator for providing an indication when proper white balance has been achieved. This indicator is comprised of an AND gate 60 whose output terminal 61 is connected to a visual indicator 62. AND gate 60 includes a pair of inputs connected to the outputs of AND gates 43R and 43B, respectively, to receive inhibit signals $S_{SR}$ and $S_{SB}$. Visual indicator 62 may comprise any suitable light source, such as an LED, or the like. It is recalled that, when error signal $S_{ER}$ has been sufficiently modified so as to fall within the window defined by reference levels $V_H$ and $V_L$, then the color difference signal R-Y derived at the output of combining circuit in channel 20R is properly white balanced. When this occurs, inhibit signal $S_{SR}$ is a binary "1". It is appreciated that when the blue error signal $S_{EB}$ falls within the window defined by reference levels $V_H$ and $V_L$ in channel 20B, then the color difference signal B-Y derived at the output of the combining circuit included in this channel likewise is properly white balanced. When this occurs, inhibit signal $S_{SB}$ also is a binary "1". AND gate 60 detects the coincidence of a binary "1" in each of these inhibit signals to energize visual indicator 62. Thus, when indicator 62 is energized, each of color difference signals R-Y and B-Y is within its respective window, corresponding to a proper white balance. Consequently, an operator can easily and rapidly detect when a white balance adjustment operation is complete. When indicator 62 is energized, switch SW then can be switched from its adjustment condition to its normal condition. Color video signals subsequently produced by the video camera apparatus will, of course, be properly white balanced.

The embodiment shown in FIG. 6 also provides an indication of the color temperature of white unbalance. As is known, if the lighting condition of an object is of a relatively high color temperature, then the red color difference R-Y is less than zero, that is, it is negative, while the blue color difference signal B-Y is greater than zero, that is, it is positive. Conversely, if the lighting condition of an object is of a relatively low color temperature, then the red color difference signal R-Y is greater than zero, or positive, while the blue color difference signal B-Y is less than zero, or negative. These color temperature conditions are indicated by circuits 80 and 70, respectively. That is, circuit 80 includes an output terminal 83 whereat a binary "1" is produced if the color temperature of an illuminated object is high; and circuit 70 includes an output terminal 73 whereat a binary "1" is produced in the event that the color temperature of an illuminated object is relatively low.

Circuit 80 includes logic inverters 81A and 81B connected to the outputs of comparators 42R and 41B, respectively. The outputs of inverters 81A and 81B are connected to respective inputs of an OR gate 82 whose output is connected to output terminal 83. Circuit 70 is of similar construction and includes inverters 71A and 71B connected to the outputs of comparators 41R and 42B, respectively. The outputs of inverters 71A and 71B are connected to respective inputs of OR gate 72 whose output is connected to output terminal 73.

If the color temperature of the illuminated object is high, then the color difference signal R-Y is less than reference level $V_L$. This means that the output of comparator 42R is of negative polarity. Inverter 81A inverts this negative polarity to supply a binary "1" through OR gate 82 to output terminal 83, thereby indicating a high color temperature. Also, for a high color temperature, the blue color difference signal B-Y exceeds reference level $V_H$, resulting in a relatively negative signal at the output of comparator 41B. This negative signal is inverted by inverter 81B to supply a binary "1" through OR gate 82 to output terminal 83, thereby indicating the high color temperature.

For a low color temperature, the red color difference signal R-Y exceeds reference level $V_H$. This condition results in a relatively negative signal at the output of comparator 41R. Inverter 71A inverts this signal to a binary "1" which is supplied through OR gate 72 to output terminal 73, thereby providing an indication of the low color temperature. Also, a low color temperature is represented by the blue color difference signal B-Y being less than reference level $V_L$. this condition results in a relatively negative signal at the output of comparator 42B. Inverter 71B inverts this signal to a binary "1" which is supplied through OR gate 72 to output terminal 73.

Thus, if a white balance cannot be attained, an operator readily may determine the reason for this loss of white balance. If either circuit 70 or circuit 80 produces a binary "1" at its respective output terminal, an operator will be apprised of the relative color temperature of the illuminated object and will recognize that a color temperature correcting filter either should be added or changed. Suitable display lamps, LED's, or other indicators may be connected to output terminals 73 and 83 to provide the respective low and high color temperature indications to the operator.

Thus, by providing indicator 62 and color temperature indicating circuits 70 and 80, an operator, such as a cameraman, will be supplied with information apprising him as to the white balance condition of the camera apparatus and, if necessary, the need for color temperature filter correction. Hence, the cameraman will be enabled to rapidly and efficiently adjust the white balance of the video signals correctly.

While the present invention has been particularly shown and described in the environment of a white balance control system for use in video camera apparatus, it should be readily appreciated that the memory-type control system disclosed herein admits of various other uses. For example, the embodiment shown in FIG. 4 can be used as a memory-type automatic frequency control (AFC) system, an automatic phase (APC) system, or the like. Still further, this invention can be used in other feedback or servo control environments whereby a control signal is produced and stored in digital form for subsequent use to control any predetermined parameter of an input signal. It will be readily apparent to those of ordinary skill in the art that various changes and modifications in form and details in addition to those changes noted hereinabove can be made without departing from the spirit and scope of the invention. Therefore, it is intended that the appended claims be interpreted as including such changes and modifications.

What is claimed is:

1. A memory-type control system for producing and storing a control signal, comprising:

signal providing means for providing a signal having a level to be controlled;

detecting means for receiving said signal for detecting when said level is within a predetermined range;

a source of clock pulses;

UP/DOWN counting means for counting said clock pulses, said UP/DOWN counting means being responsive to said detecting means for counting in one direction when said level is greater than said predetermined range, for counting in a second direction when said level is less than said predetermined range and for ceasing said counting when said level is within said range so as to store the last-attained count;

level control means coupled to said counting means for using said count as a control signal to adjust said level so as to bring said level within said predetermined range:

preset means for presetting said counting means with a predetermined count; and switch means having a first condition to inhibit said counting means and being operable to a second condition to load said counting means with said predetermined count and to enable said counting means for initiating a level adjustment operation by said detecting means, said counting means and said level control means.

2. The system of claim 1 wherein said detecting means comprises first comparator means and means for supplying said first comparator means with a reference signal corresponding to the upper limit of said predetermined range, said first comparator means producing a first count direction signal when said level exceeds said upper limit reference signal and a second count direction signal when said level is less than said upper limit reference signal; second comparator means and means for supplying said second comparator means wth a reference signal corresponding to the lower limit of said predetermined range, said second comparator means producing an output signal when said level exceeds said lower limit reference signal; means for applying said first and second count direction signals to said counting means to determine the count direction thereof; coincidence means for producing a stop signal upon the coincidence of a selected one of said count direction signals and said output signal; and means for applying said stop signal to said counting means to stop the counting thereof.

3. The system of claim 1 wherein said level control means comprises level adjusting means for adjusting the level of said signal, and digital-to-analog converting means for converting the count of said counting means to an analog level control signal and for applying said level control signal to said level adjusting means.

4. A memory-type white balance control system for controlling the white balance of color video signals produced by video camera apparatus, comprising:
means for producing color difference signals corresponding to an object viewed by said camera apparatus;
means for producing a component of said color difference signals;
combining means for combining said component with said color difference signals to produce white-balanced color difference signals;
sensing means for sensing when the object viewed by said camera is a white object;
detecting means responsive to said sensing means for detecting when the level of a white-balanced color difference signal is within a predetermined range;
a source of clock pulses;
UP/DOWN counting means for counting said clock pulses, said UP/DOWN counting means being responsive to said detecting means for counting in one direction when said level of said white-balanced color difference signal is greater than said predetermined range, for counting in a second direction when said level is less than said predetermined range and for ceasing said counting when said level is within said predetermined range so as to store the last-attained count; and
automatic gain control means responsive to the count of said counting means for controlling the level of said component which is combined with said color difference signals.

5. The system of claim 4 further comprising actuable switch means having a first condition for inhibiting the count to which said automatic gain control means is responsive from changing and a second condition for permitting the count to which said automatic gain control means is responsive to change.

6. The system of claim 5 wherein said actuable switch means comprises a manual switch.

7. The system of claim 5 further comprising means for providing a pre-set count; and means responsive to the actuation of said switch means from the first condition to the second condition thereof for loading said pre-set count into said counting means.

8. The system of claim 4 wherein said detecting means comprises sampling means for sampling said white-balanced color difference signal when said sensing means senses that the object viewed by said camera is a white object; comparator means for comparing the sampled white-balanced color difference signal to a high reference level and to a low reference level to produce a count-down signal if said sampled white-balanced color difference signal exceeds said high reference level and a count-up signal if said sampled white-balanced color difference signal is less than said high reference level, and to produce a count-enable signal if said sampled white-balanced color difference signal is less than said low reference signal and a count-inhibit signal if said sampled white-balanced color difference signal exceeds said low reference signal; and coincidence detecting means for detecting the coincidence of said count-up and said count-inhibit signals so as to inhibit further counting by said counting means.

9. The system of claim 8 wherein said sensing means comprises pulse generating means for generating at least one pulse of predetermined amplitude and duration during a preselected portion of each frame interval of the video signals produced by said camera; means for superposing said pulse and said component of said color difference signal; and sampling signal generating means for supplying a sampling signal to said sampling means when the superposed pulse and component exceeds a threshold level.

10. The system of claim 9 wherein said component is a luminance signal Y and said color difference signal is the difference between a color signal R, G or B and said luminance signal Y.

11. A memory-type white balance control system for controlling the white balance of color video signals produced by video camera apparatus, comprising:
means for producing first and second color difference signals corresponding to an object viewed by said camera apparatus;
means for producing a component of said color difference signals;
sensing means responsive to the level of said component for sensing when the object viewed by said camera is a white object;
first and second combining means for combining said component with said first and second color difference signals, respectively to produce first and second white-balance color difference signals;
first and second sampling means responsive to said sensing means for sampling said first and second white-balanced color difference signals, respectively;
first and second range comparators for determining if said first and second white-balanced color difference signals are within first and second amplitude ranges, respectively, to produce first and second count-down signals if said first and second sampled white-balanced color difference signals exceed the upper limits of said first and second ranges, respectively, first and second count-up signals if said first and second sampled white-balanced color difference signals are less than the lower limits of said first and second ranges, respectively, and stop signals if said first and second sampled white-balanced color difference signals are within said first and second ranges, respectively;

a source of clock pulses;

first and second UP/DOWN counting means for counting said clock pulses, said first and second counting means being responsive to said first and second count-down, count-up and stop signals, respectively, for counting in a downward direction, counting in an upward direction and stopping said counting;

first and second automatic gain control means responsive to the count of said first and second counting means, respectively, for controlling the level of said component which is combined with a respective one of said first and second color difference signals; and indicating means responsive to said first and second stop signals for indicating when said first and second white-balanced color difference signals are balanced properly.

12. The system of claim 11 wherein said indicating means comprises coincidence detecting means for detecting the coincidence of said first and second stop signals; and a visual indicator energized by said coincidence detecting means.

13. The system of claim 12 wherein said indicating means further comprises means coupled to said first and second range comparators for detecting the relative color temperature of the viewed object in the event that said white-balanced color difference signals are not balanced properly.

14. The system of claim 13, wherein said means for detecting the relative color temperature comprises means for detecting a relatively low color temperature if said first sampled white-balanced color difference signal exceeds the upper limit of said first range of if said second sampled white-balanced color difference signal is less than the lower limit of said second range; and means for detecitng a relatively high color temperature is said first sampled white-balanced color difference signal is less than the lower limit of said first range or if said second sampled white-balanced color difference signal exceeds the upper limit of said second range.

15. The system of claim 11 wherein said sensing means comprises pulse generating means for generating a pulse of predetermined duration during a predetermined horizontal line interval in a field of the video signals produced by said camera; means for superposing said pulse and said component of said color difference signals; and sample signal generating means for generating and supplying a sampling signal to said first and second sampling means when the superposed pulse and component exceeds a threshold level; and wherein said source of clock pulses comprises means for supplying clock pulses at a frequency synchronized with the vertical synchronizing frequency of said video signals.

16. The system of claim 15 wherein each of said sampling means comprises sample and hold means responsive to said sampling signal for sampling a respective white-balanced color difference signal and for substantially holding the sampled signal until the occurrence of the next sampling signal; and averaging means for averaging the sampled signals over a duration of time, said averaged sampled signals being supplied to a respective range comparator.

17. The system of claim 11 further comprising a manual switch operable to be energized for initiating a white balance operation and to be de-energized for terminating said white balance operation; first and second means for providing respective pre-set counts; first and second means responsive to the energization of said manual switch for loading said pre-set counts into said first and second counting means, respectively; and means for inhibiting further counting of said first and second counting means in response to the de-energization of said manual switch.

18. The system of claim 11 wherein said first and second color difference signals are R-Y and B-Y signals, respectively, and said component is the luminance component Y.

19. A memory-type control system for producing and storing a control signal, comprising:

signal providing means for providing a signal having a level to be controlled;

detecting means receiving said signal to be controlled for detecting when said level is within a predetermined range;

a source of clock pulses;

UP/DOWN counting means for counting said clock pulses, said UP/DOWN counting means being responsive to said detecting means for counting in one direction when said level is greater than said predetermined range, for counting in the other direction when said level is less than said predetermined range and for ceasing said counting when said level is within said range so as to store the last-attained count;

level control means coupled to said counting means and using said count as a gain control signal to adjust said level so as to bring said level within said predetermined range, said level control means including level adjusting means for adjusting the level of said signal, and digital-to-analog converting means for converting the count of said counting means to an analog level control signal and for applying said analog level control signal to said level adjusting means; and said signal providing means including a source of color video signals representing a white object, means for deriving a color difference signal corresponding to said white object, means for providing a component of said color difference signal, and means for algebraically combining said component and said color difference signal so as to vary the level of said color difference signal, said component being applied to said algebraic combining means through said level adjusting means.

* * * * *